United States Patent
Mizutani

(10) Patent No.: US 7,541,873 B2
(45) Date of Patent: Jun. 2, 2009

(54) HIGH FREQUENCY AMPLIFIER CONFIGURATION FOR IMPROVED FEEDBACK CAPACITANCE NEUTRALIZATION

(75) Inventor: Hiroshi Mizutani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 87 days.

(21) Appl. No.: 11/808,666

(22) Filed: Jun. 12, 2007

(65) Prior Publication Data
US 2007/0296506 A1 Dec. 27, 2007

(30) Foreign Application Priority Data
Jun. 13, 2006 (JP) ............................. 2006-163339

(51) Int. Cl.
*H03F 1/14* (2006.01)
*H03F 1/34* (2006.01)
(52) U.S. Cl. ...................................... 330/292; 330/294
(58) Field of Classification Search ................. 330/109, 330/292, 294
See application file for complete search history.

(56) References Cited

U.S. PATENT DOCUMENTS
6,225,756 B1 * 5/2001 Gitsevich .................... 315/248

FOREIGN PATENT DOCUMENTS
| JP | 2000-196365 | 7/2000 |
| JP | 2002-171139 | 6/2002 |
| JP | 2005-176331 | 6/2005 |

* cited by examiner

*Primary Examiner*—Steven J Mottola
(74) *Attorney, Agent, or Firm*—McGinn IP Law Group, PLLC

(57) ABSTRACT

A high frequency amplifier is provided with: an input terminal receiving a high frequency signal; an output terminal; a three-terminal active element having a first terminal connected with the input terminal and a second terminal connected with the output terminal; a transmission line; and a capacitive structure. The three-terminal active element outputs an output signal from the output terminal in response to the high frequency signal. The transmission line and the capacitive structure are connected in series between the first and output terminals, and operate together as a series resonance circuit. The transmission line functions as an open stub at a series resonance frequency of the series resonance circuit.

14 Claims, 8 Drawing Sheets

HIGH FREQUENCY AMPLIFIER CONFIGURATION FOR IMPROVED FEEDBACK CAPACITANCE NEUTRALIZATION

BACKGROUND OF THE INVENTION

1. Field of the Invention

The present invention relates to a high frequency amplifier, more particularly, to a high frequency amplifier for amplifying a high frequency signal, such as a microwave signal and a millimeter wave signal.

2. Description of the Related Art

Recently, high frequency amplifiers integrating active elements, such as field effect transistors (FETs), are widely used to amplify high frequency signals in microwave bands and millimeter wave bands. One issue in amplifying a high frequency signal is that a high frequency amplifier may suffer from undesirable oscillation due to the feedback capacitance of an active element between the input terminal and output terminal. In detail, an output signal may be undesirably fed back from the output terminal to the input terminal through the feedback capacitance formed within an active element, and the operation of the amplifier may become instable to cause oscillation, when the output signal is positively fed back.

In order to stabilize the operation of an amplifier incorporating an active element, it is desirable to reduce the feedback capacitance of the active element or to neutralize the feedback capacitance by adding an external circuit. Since it is impossible to reduce the feedback capacitance down to zero, a generally used approach is to add an external circuit which equivalently reduces the feedback capacitance down to zero; such external circuit is referred to as a neutralization circuit, hereinafter. The neutralization circuit effectively eliminates the feedback signal and thereby allows maximizing the power gain of the high frequency amplifier.

In the following, a description is given of the ideal principle of a neutralization circuit of a high frequency amplifier. FIG. 8A is a circuit diagram illustrating an exemplarily configuration of a high frequency amplifier, and FIG. 8B is an equivalent circuit diagram of the high frequency amplifier shown in FIG. 8A; such neutralization circuit configuration is disclosed in Japanese Laid Open Patent Application No. JP-A 2005-176331, for example. Referring to FIG. 8A, the high frequency amplifier is provided with an amplifying FET and an inductor element Lext connected between the gate and drain of the amplifying FET. The gate and drain of the amplifying FET are connected with the input and output terminals of the high frequency amplifier, respectively. The inductor element Lext functions as a neutralization circuit. In this circuit configuration, the amplifier exhibit the parallel resonance between the gate and drain of the amplifying FET when the input signal has a frequency of $f_{p0}$ defined as follows:

$$f_{p0} = \frac{1}{2\pi\sqrt{C_{gd}L_{ext}}} \quad (1)$$

where $C_{gd}$ is the gate-drain capacitance of the amplifying FET.

The impedance between the gate and drain of the amplifying FET is infinitely great at the parallel resonance frequency $f_{p0}$. When a signal of a frequency equal to the parallel resonance frequency $f_{p0}$ is inputted, the feedback capacitance is "neutralized", that is, the gate and drain is electrically isolated with respect to the high frequency. When the feedback capacitance is "neutralized", the reverse gain from the drain (the output terminal) to the gate (the input terminal) is reduced down to zero, and the amplifier exhibits the maximum forward gain.

In an actual circuit, DC isolation is required between the gate and drain of the amplifying FET to provide different bias voltages for the gate and drain. Japanese Laid Open Patent Application No. JP-A 2000-196365 (hereinafter, referred to as the '365 application) discloses a neutralization circuit with DC isolation between the input and output terminals of a high frequency amplifier. FIG. 9 is a circuit diagram illustrating the configuration of the high frequency amplifier disclosed in the '365 application.

The high frequency amplifier shown in FIG. 9 is composed of an amplifying FET 20, and a parallel circuit connected between the gate and drain of the amplifying FET 20. The parallel circuit includes a DC-isolation capacitor 10, an inductor element 21 for causing parallel resonance, a switching FET 22, and a resistor element connected between the switching FET 22.

In a relatively low frequency range of several GHz, the high frequency amplifier of FIG. 9 operates as follows: When the amplifying FET 20 is placed into the operation state, the switching FET 22 is turned off to thereby make the parallel circuit become the open state. When the amplifying FET 20 is placed in the non-operation state, on the other hand, the switching FET 22 is turned on, and the gate and drain of the amplifying FET 20 is electrically connected through the parallel circuit. This connection causes parallel resonance of the gate-drain capacitance Cgd and the inductor element 21.

According to such operation, the isolation between the input and output of the high frequency amplifier is improved by about 15 dB at the resonance frequency $f_{p0}$ for the non-operation state of the amplifying FET 20. For the operation state, the forward gain of the amplifier is as large as that for the case when the feedback capacitance is not neutralized. When the high frequency amplifier shown in FIG. 9 is operated, the operation frequency is usually set to the resonance frequency $f_{p0}$.

Although the high frequency amplifier disclosed in the '365 application achieves the neutralization of the feedback capacitance for the non-operation state to improve the isolation between the input and output, the high frequency amplifier suffers from a problem that the feedback capacitance is not neutralized to maximize the forward gain of the high frequency amplifier for the operation state.

One approach for neutralizing the feedback capacitance in the operation state may be using a neutralization circuit consists of a DC isolation capacitor 10 and an inductor element 21 as shown in FIG. 10; however, the inventor has discovered that the neutralization circuit shown in FIG. 10 undesirably exhibits negative resistance characteristics at the series resonance frequency, which is the frequency at which the neutralization circuit exhibits series resonance, and the negative resistance characteristics makes the amplifier operation unstable. When the input signal has a frequency identical to the series resonance frequency, the drain and gate is short-circuited, and the signal is directly fed back from the output terminal to the input terminal to cause the negative resistance characteristics. In the following, a description is given of the mechanism in which the neutralization circuit exhibits negative resistance characteristics.

The series resonance frequency $f_{io}$ is expressed by the following formula:

$$f_{i0} = \frac{1}{2\pi}\sqrt{\frac{1}{L_{ext}C_{ext}}} \quad (2)$$

where $L_{ext}$ is the inductance of the inductor 21, and $C_{ext}$ is the capacitance of the DC isolation capacitor 20. When $C_{ext}$ is 8 fF and $L_{ext}$ is 14 µH, the series resonance frequency $f_{io}$ is 15 GHz. In this case, the frequency characteristics of the input/output return losses $S_{11}$ and $S_{22}$ between the gate and drain are obtained as shown in FIG. 11 for Cgd being 20 fF. As shown in FIG. 11, the input return loss $S_{11}$ is larger than 0 dB in the frequency range between 16.1 GHz (denoted by A1) and 17.7 GHz (denoted by A2). Therefore, the reflection coefficient Γ in this frequency range is plotted on the Smith chart in the region out of the circle corresponding to |Γ|=1. In other words, the neutralization circuit exhibits negative resistance characteristics in the frequency range between 16.1 GHz and 17.7 GHz. Therefore, the operation of the high frequency amplifier is unstable in this frequency region; the high frequency amplifier may oscillate depending on the external circuit connected thereto. As thus described, a high frequency amplifier with a neutralization circuit consisting of a DC isolation capacitor and an inductor element suffers from a problem that the high frequency amplifier unstably operates in the frequency region around the series resonance frequency $f_{io}$.

In general, an amplifier circuit with a feedback circuit is designed to achieve stable operation by incorporating a resistor into the feedback circuit to thereby reduce the gain thereof. When this technique is applied to the neutralization circuit, however, this approach undesirably increases the loss in the neutralization circuit, and therefore reduces the power gain of the high frequency amplifier below the forward gain of the amplifying FET.

Japanese Laid Open Patent Application No. JP-A 2002-171139 discloses another neutralization circuit configuration for avoiding negative feedback from the output terminal to the input terminal, in which the neutralization circuit consists of a capacitor and inductor which are connected in parallel; however, this application is silent on avoiding negative resister characteristics.

SUMMARY

In one embodiment, a high frequency amplifier is provided with an input terminal receiving a high frequency signal, an output terminal, a three-terminal active element having a first terminal connected with the input terminal and a second terminal connected with the output terminal, a transmission line, and a capacitive structure. The three-terminal active element outputs an output signal from the output terminal in response to the high frequency signal. The transmission line and the capacitive structure are connected in series between the first and output terminals, and operate together as a series resonance circuit. The transmission line functions as an open stub at a series resonance frequency of the series resonance circuit.

This configuration effectively avoids the negative resistance characteristics at the series resonance frequency, since the input impedance of the high frequency amplifier is reduced to zero at the series resonance frequency due to the fact that the transmission line functions as an open stub at the series resonance frequency.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
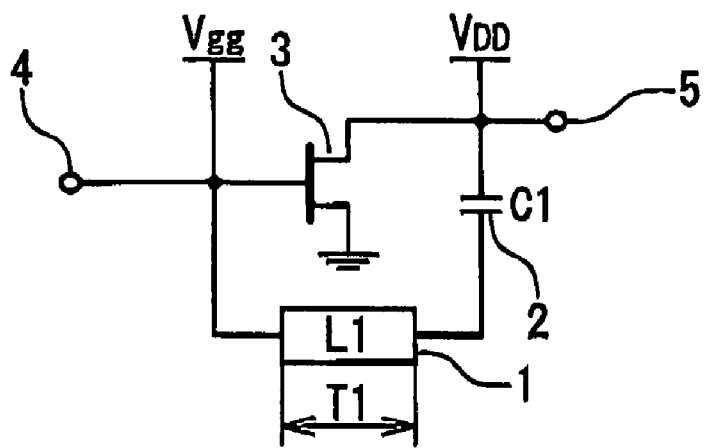
FIG. 1 is a circuit diagram illustrating an exemplary configuration of a high frequency amplifier according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes. It should be noted that same or similar elements are denoted by same or similar reference numerals in the drawings. In the following, a description is given of embodiments directed to high frequency amplifiers for amplifying high frequency signals in the microwave or millimeter wave band.

First Embodiment (Circuit Configuration)

FIG. 1 is a circuit diagram illustrating the configuration of a high frequency amplifier according to a first embodiment of the present invention. The high frequency amplifier according to the first embodiment is provided with an amplifying FET 3 disposed between an input terminal 4 and an output terminal 5, and a transmission line 1. One end of the transmission line 1 is connected with the gate of the amplifier FET 3, and the other end is connected with the drain of the amplifier FET 3 through a capacitive structure 2 having a capacitance C1. The transmission line 1 and the capacitive structure 2 operate together as a series resonance circuit. The input terminal 4 externally receives a high frequency signal through an input matching circuit (not shown). The output terminal 5 externally outputs a high frequency signal amplified by the amplifying FET 3 through an output matching circuit (not shown) The gate of the amplifying FET 3 is connected with the input terminal 4 and the one end of the transmission line 1. The drain of the amplifying FET 3 is connected with the other end of the transmission line 1 through the capacitive structure 2, and also connected with the output terminal 5. The drain of the amplifying FET 3 is further connected with a power supply terminal, and therefore pulled up to the power supply level $V_{DD}$. The source of the amplifying FET 3 is grounded. A bias voltage Vgg is fed to the gate of the amplifying FET 3 to control the current through the amplifying FET 3. The amplifying FET 3 amplifies the high frequency signal received from the input terminal 3 and outputs the amplified high frequency signal from the output terminal 5.

The transmission line 1 is branched from the gate of the amplifying FET 3, and capacitively connected with the drain of the amplifying FET 3 with a capacitance C1. In other words, the capacitive structure 2 having the capacitance C1 is formed between the transmission line 1 and the drain of the amplifying FET 3. The transmission line 1 has a length of T1, which is equal to or longer than one fourth of the propagation wavelength at the operation frequency. The inductance L1 of the transmission line 1 depends on the dimensions of the transmission line 1, including the length T1 and the width W. The series resonance frequency $f_{iO}$, of the series resonance circuit constituted by the transmission line 1 and the capacitive structure 2 depends on the inductance L1 of the transmission line 1 and the capacitance C1 of the capacitive structure 2. Therefore, the inductance L1 and length T1 of the transmission line 1, and the capacitance C1 of the capacitive structure 2 are preferably adjusted on the basis of the desired series resonance frequency $f_{iO}$.

In one embodiment, the amplifier FET 3 is a FET chip that is flip-chip connected with an $Al_2O_3$ substrate having a thickness of 200 μm. In a preferred embodiment, a micro strip line formed on the $Al_2O_2$ substrate is used as the transmission line 1. In this case, a ground plate is attached on the rear surface of the $Al_2O_3$ substrate.

The capacitance C1 of the capacitive structure 2 is adjusted to a small value so as to provide a large impedance for the capacitive structure 2. As a result, the transmission line 1 is open-ended on the side of the capacitive structure 2 at the series resonance frequency fi0, functioning as an open stub. The capacitive structure 2 with a small capacitance C1 may be formed as a coupling capacitance between the transmission line 1 and a signal line connected between the output terminal 5 and the drain of the amplifying FET 3; the transmission line 1 may be opposed to the signal line connected between the output terminal 5 and the drain of the amplifying FET 3 across a spacing within the package.

The dimensions of the transmission line 1 (including the length T1 and the width W) are designed on the basis of the operation frequency of the high frequency amplifier and the series resonance frequency $f_{iO}$. The length T1 of the transmission line 1 is adjusted to be equal to or longer than one fourth of the propagation wavelength at the operation frequency. Additionally, the length T1 of the transmission line 1 is adjusted to satisfy the following equation:

$$T1 = \lambda \times (1/4) \times (2n-1),$$

where λ is the propagation wavelength at the series resonance frequency $f_{iO}$ and n is a natural number. It should be noted that the propagation wavelength is the wavelength of the signal transmitted over the transmission line 1.

The operation frequency of the high frequency amplifier is determined on the basis of the neutralization frequency $f_u$, at which the feedback capacitance of the amplifying FET 3 is neutralized. It is preferable that the operation frequency is identical to the neutralization frequency $f_u$. In other words, it is preferable that the transmission line 1 and the capacitive structure 2 are designed so that the feedback capacitance of the amplifying FET 3 is neutralized at the operation frequency. The capacitance C1 of the capacitive structure 2 and the series resonance frequency fi0 (that is, the length T1 of the transmission line 1) are adjusted to achieve gate-drain isolation (that is, feedback capacitance neutralization) at the operation frequency (which is approximately equal to the neutralization frequency $f_u$), on the basis of a formula (5) described later. The inductance L1 of the transmission line 1 (that is, the width W of the transmission line 1) is determined depending on the capacitance C1 and the length T1 on the basis of the formula (2). Instead, the dimensions of the transmission line 1 and the capacitance C1 of the capacitive structure 2 may be designed first. In this case, the series resonance frequency $f_{iO}$ and the operation frequency are determined accordingly.

In one embodiment, the operation frequency is determined as 17.8 GHz, and the length T1 of the transmission line 1 is determined as being equal to or longer than one fourth of the propagation wavelength at the frequency of 17.8 GHz (that is, 1.78 mm). For a series resonance frequency $f_{iO}$ of 15 GHz, the length T1 of the transmission line 1 is adjusted to 2.2 mm, which is one fourth of the propagation wavelength λ at the series resonance frequency $f_{iO}$ of 15 GHz. In this case, the inductance L1 of the transmission line 1 is 14 nH, when the width W of the transmission line 1 is 0.075 mm. The desired capacitance C1 of the capacitive structure 2 is obtained as 8 fF by substituting the series resonance frequency $f_{iO}$ of 15 GHz and the inductance L1 of 14 nH. The capacitive structure 2 may be designed to have the desired capacitance C1 by using a 3D electromagnetic field simulator. In the following, a description is given of details of the feedback capacitance neutralization and the design of the high frequency amplifier according to the first embodiment.

(Circuit Operation)

Figure 2:
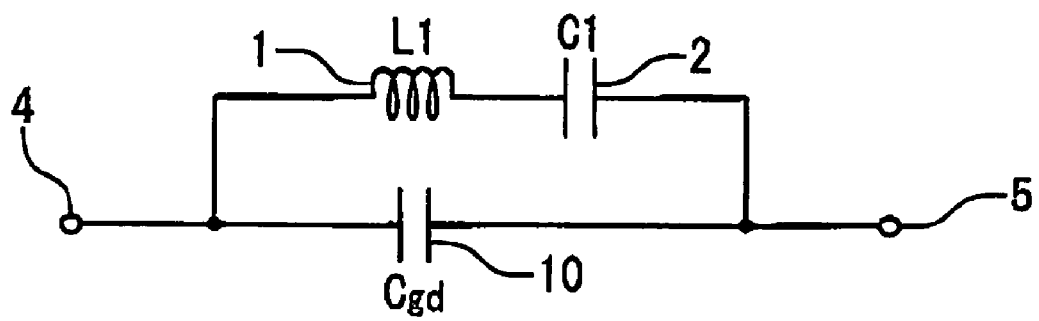
FIG. 2 is an equivalent circuit diagram illustrating feedback capacitance neutralization within the high frequency amplifier according to the first embodiment.

FIG. 2 is an equivalent circuit of the high frequency amplifier, schematically illustrating the model of the feedback capacitor neutralization. In FIG. 2, the feedback capacitance of the amplifying FET 3 is denoted by the symbol "$C_{gd}$". It should be noted that the feedback capacitance neutralization means achieving isolation between the input terminal 4 and the output terminal 5 at high frequencies by neutralizing the feedback capacitor.

As shown in FIG. 2, the transmission line 1 (with the inductance L1) and the capacitive structure 2 with the capacitance C1 are connected in series to function as an external neutralization circuit connected in parallel to the feedback capacitance $C_{gd}$. The external neutralization circuit operates as a series resonance circuit. When the feedback capacitor neutralization is achieved at the neutralization frequency $f_u$, the gate-drain impedance $Z_{gd}$ is infinitely great. It should be noted that the gate-drain impedance $Z_{gd}$ is expressed by the following formula:

$$Z_{gd} = \frac{1 - \omega^2 L_1 C_1}{j\omega(C_1 + C_{gd} - \omega^2 L_1 C_1 C_{gd})} \quad (3)$$

At the neutralization frequency $f_u$, the denominator of the formula (3) is zero, since the gate-drain impedance $Z_{gd}$ is infinitely great. Therefore, the neutralization frequency $f_u$ is obtained as follows:

$$f_u = \frac{1}{2\pi}\sqrt{\frac{1}{L_1}\left(\frac{1}{C_{gd}} + \frac{1}{C_1}\right)} \quad (4)$$

On the other hand, the series resonance frequency $f_{i0}$ is obtained from the above-described formula (2). Therefore, the ratio of the neutralization frequency $f_u$ to the series resonance frequency $f_{i0}$ is:

$$\frac{f_u}{f_{i0}} = \sqrt{\frac{C_{gd} + C_1}{C_{gd}}} = \sqrt{1 + \frac{1}{k}} \quad (5)$$

where $k = C_{gd}/C_1$. It should be noted that it always holds:

$$f_u \geq f_{i0},$$

since $k > 0$.

It should be noted that C1 is determined so as not to be excessively small compared to $C_{gd}$. When $k \gg 1$ (that is, $C_{gd} \gg C_1$), the neutralization frequency $f_u$ is approximately equal to the series resonance frequency $f_{i0}$, and the gate and drain of the amplifying FET 3 is short-circuited at the neutralization frequency $f_u$; this causes the gain to be reduced to zero.

When $k = 1$ (that is, $C_{gd} = C_1$) on the other hand, it holds:

$$f_u = \sqrt{2} f_{i0}$$

Therefore, it is possible to provide a sufficient difference between the neutralization frequency $f_u$ and the series resonance frequency $f_{i0}$ by adjusting the capacitance C1 of the capacitive structure 2 so that the feedback capacitance $C_{gd}$ is not excessively larger than the capacitance C1; the capacitance C1 is adjusted so that it does not hold:

$$C_{gd} \gg C1.$$

It should be noted that the capacitance C1 of the capacitive structure 2 may be larger than the feedback capacitance $C_{gd}$.

In the following, a description is given of an example of the operation of the high frequency amplifier according to this embodiment for the case that $C_{gd}$ is 20 fF, C1 is 8 fF, and L1 is 14 nH. In this case, the series resonance frequency $f_{i0}$ is 15.0 GHz, and the neutralization frequency $f_u$ is 17.8 GHz.

Figure 10:
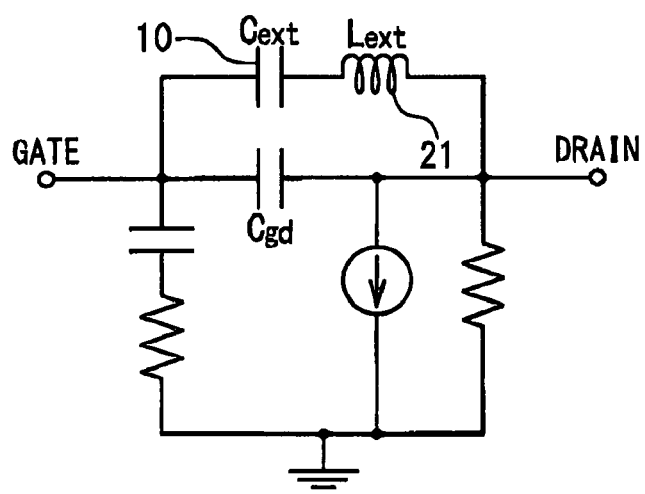
FIG. 10 is an equivalent circuit diagram of a conventional high frequency amplifier.
Figure 11:
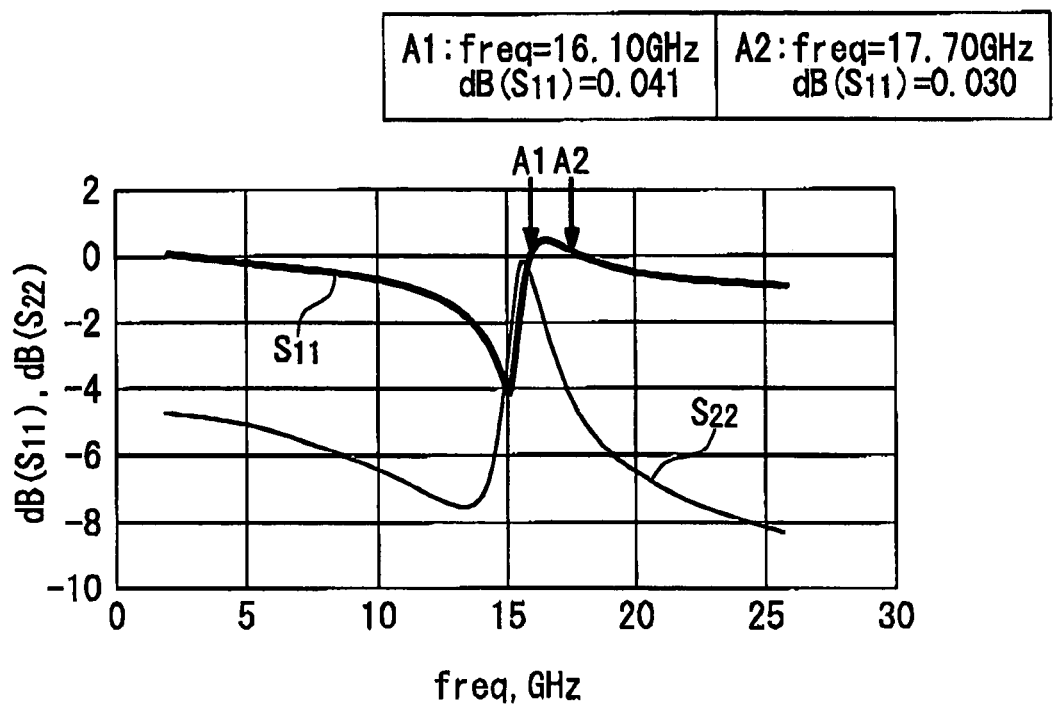
FIG. 11 is a graph illustrating the frequency characteristics of the conventional high frequency amplifier shown in FIG. 10.

In this example, a micro strip line having a length equal to one fourth of the propagation wavelength at the series resonance frequency $f_{i0}$ (=15 GHz) is used as the transmission line 1 with the inductance L1. More specifically, the micro strip line has a length of 2.2 mm and a width of 0.075 mm. In this case, the input impedance of the high frequency amplifier is approximately zero (short-circuited) at the series resonance frequency $f_{i0}$ (=15 GHz). Therefore, the absolute value of the reflection coefficient $|\Gamma|$ at the input terminal 4 is fixed below one; in this case, the reflection coefficient $\Gamma$ is approximately equal to −1. This is because the impedance of the capacitive structure 2 with the capacitance C1 (=8 fF), −13263j Ω at 15 GHz (which can be approximated as open), is impedance-converted to zero (short-circuit) at 15 GHz. As thus described, the use of a micro strip line having a length equal to one fourth of the propagation wavelength at the series resonance frequency $f_{i0}$ as the inductive element of the series resonance circuit allows reducing the input impedance at the input terminal 4 down to approximately zero at the series resonance frequency $f_{i0}$. Reducing the input impedance down to approximately zero (short-circuit) in the frequency range around the series resonance frequency $f_{i0}$, at which the conventional high frequency amplifier shown in FIG. 10 suffers from operation instability, effectively stabilizes the operation of the high frequency amplifier.

As thus described, the transmission line 1 functions as an open stub (or an open-ended transmission line) in the frequency range in which the impedance of the capacitive structure 2 is large. Additionally, the length T1 of the transmission line 1 is adjusted to one fourth of the propagation frequency at the series resonance frequency $f_{i0}$, and this effectively reduces the input impedance of the high frequency amplifier (at the gate of the amplifying FET 3) down to approximately zero (short-circuit) in the frequency range around the series resonance frequency $f_{i0}$. Accordingly, the high frequency amplifier according to the first embodiment is designed to fix the input impedance to substantially zero (short-circuit) in the frequency range in which the neutralization circuit exhibits series resonance (in this embodiment, 15 to 18 GHz), avoiding the negative resistance characteristics. As thus described, the high frequency amplifier according to the first embodiment is designed so that the length T1 of the transmission line 1 is adjusted to $\lambda \times (1/4) \times (2n-1)$, and the operation frequency is determined to be higher than the series resonance frequency $f_{i0}$, preferably around the neutralization frequency $f_u$. This allows stably achieving feedback capacitor neutralization while the amplifying FET 3 is in the operation state. It should be noted that the length T1 of the transmission line 1 is adjusted to be equal to or longer than one fourth of the propagation wavelength at the operation frequency.

Figure 3:
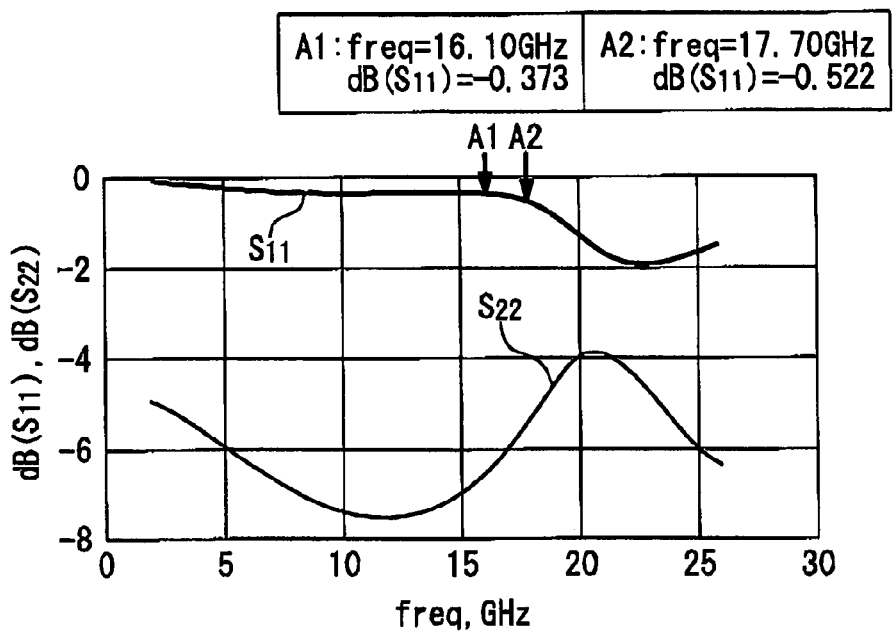
FIG. 3 is a graph illustrating the frequency characteristics of the input/output return losses of the high frequency amplifier according to the first embodiment.

FIG. 3 illustrates exemplary frequency characteristics of input/output return loses S11 and S22 of the high frequency amplifier according to the first embodiment. The input return loss $S_{11}$ is −0.373 dB at 16.1 GHz (denoted by the symbol "A1"), and −0.522 dB at 17.7 GHz (denoted by the symbol "A2"). It should be noted that the input return loss $S_{11}$ does not exceed 0 dB for any frequency; the input return loss $S_{11}$ is smaller than 0 dB in the entire frequency range between zero to 25 GHz. Therefore, the operation of the high frequency amplifier is stabilized, not suffering from negative resistance characteristics for entire frequency range between zero to 25 GHz. The feedback capacitance is neutralized at the neutralization frequency $f_u$, which is dependent on the inductance L1 of the transmission line 1, the feedback capacitance $C_{gd}$, and the capacitance C1 of the capacitive structure 2. The neutralization of the feedback capacitance effectively achieves the electrical isolation between the gate and drain of the amplifying FET 3.

Figure 4:
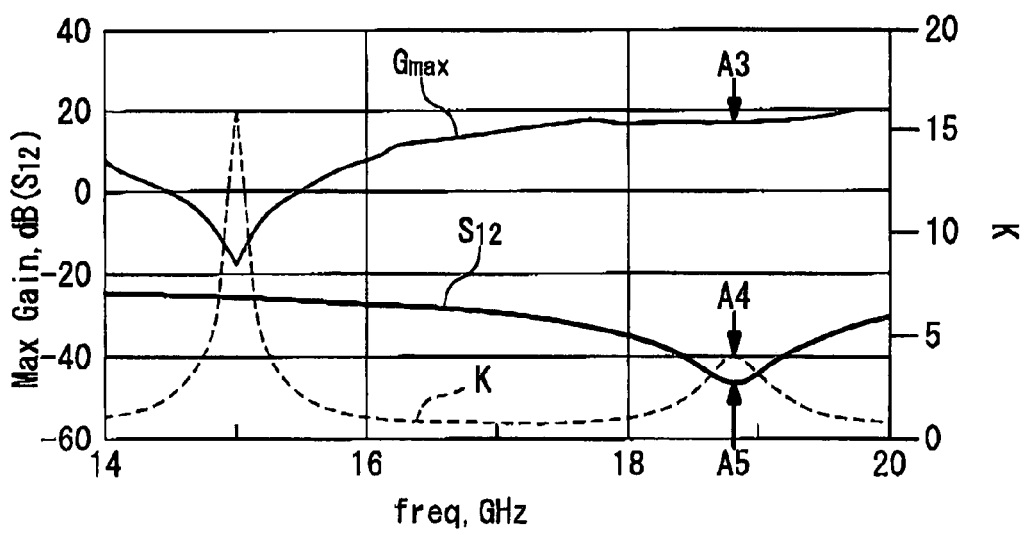
FIG. 4 is a graph illustrating RF characteristics of the high frequency amplifier according to the first embodiment.

FIG. 4 illustrates the RF characteristics of the high frequency amplifier according to the first embodiment. More specifically, FIG. 4 illustrates the maximum available gain Gmax (MaxGain), the reverse isolation S12, and the stability factor k. At an operation frequency of 18.8 GHz, the reverse isolation S12 is about −46 dB (as indicated by the symbol "A5"), and the stability factor k is 4.4 (as indicated by the symbol "A5"), exceeding one. This implies that the neutralization is achieved at the operation frequency of 18.8 GHz. Additionally, the high frequency amplifier according to the first embodiment achieves a remarkable increase in the maximum available gain with a stabilized operation; the maximum available gain Gmax is 17.8 dB (as indicated by the symbol "A3") at the operation frequency of 18.8 GHz, which is a value exceeding the maximum available gain of 13.7 dB of the conventional high frequency amplifier shown in FIG. 10, by 4 dB.

As thus described, the feedback capacitance neutralization is stably achieved due to the parallel resonance of the inductance L1 of the transmission line 1 and the feedback capacitance $C_{gd}$ between the gate and drain of the amplifying FET 3, while the amplifying FET 3 is kept activated, wherein the length T1 of the transmission line 1 is 2.2 mm, which is identical to one fourth of the propagation wavelength at the series resonance frequency $f_{iO}$ (15.0 GHz), and longer than one fourth of the propagation wavelength at the operation frequency of 18.8 GHz (that is, 1.78 mm), and the transmission line 1 is formed on the $Al_2O_3$ substrate having a thickness of 200 μm.

It should be noted that the transmission line 1 may be formed as other kinds of transmission lines, such as a coplanar waveguide. Furthermore, a bipolar transistor may be used as the active element within the high frequency amplifier, in place of the amplifying FET 3. In this case, the base of the bipolar transistor is connected with the input terminal 4, and the collector is connected with the output terminal 5.

Second Embodiment (Circuit Configuration)

Figure 5:
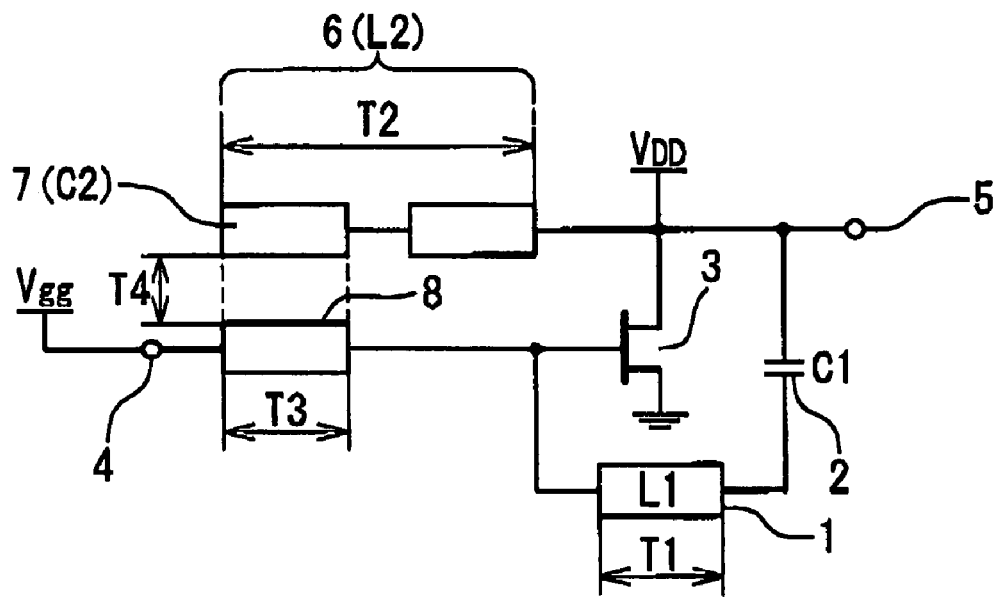
FIG. 5 and 5A, respectively, is a circuit diagram illustrating an exemplary configuration of a high frequency amplifier according to a second embodiment of the present invention.

FIG. 5 is a circuit diagram illustrating the configuration of the high frequency amplifier according to a second embodiment of the present invention. The configuration of the high frequency amplifier according to the second embodiment is almost similar to that of the high frequency amplifier according to the first embodiment. The difference is as follows:

As shown in FIG. 5, the high frequency amplifier according to the second embodiment provided with a pair of series resonance circuits connected between the gate and drain of the amplifying FET 3. One of the series resonance circuits (referred to as the first series resonance circuit, hereinafter) is composed of a transmission line 1 and a capacitive structure 2, and the other series resonance circuit (referred to as the second series resonance circuit, hereinafter) is composed of a transmission line 6. An end portion of the transmission line 6 is opposed to a signal line 8 connected between the input terminal 4 and the gate of the amplifying FET 3, and the end portion and the signal line 8 forms a coupled transmission line functioning as another capacitive structure; the end portion is referred to as the coupling portion 7, hereinafter. The length T1 of the transmission line 1 and the length T2 of the transmission line 6 are equal to or longer than one fourth of the propagation wavelength at the operation frequency. The lengths T1 and T2 of the transmission lines 1 and 6 are desirably adjusted so that the first and second series resonance circuits have the same series resonance frequency. It should be noted, however, that the lengths T1 and T2 of the transmission lines 1 and 6 may be different under the conditions in which the series resonance frequencies of the first and second series resonance circuits are not largely different, the transmission line 1 functions as an open stub at the series resonance frequency thereof, and the transmission line 6 functions as another open stub at the series resonance frequency thereof.

In one embodiment, the transmission line 6 is formed as a micro strip line on an $Al_2O_3$ substrate having a thickness of 200 μm. When the operation frequency is 20 GHz, for example, the transmission line 6 is formed to have a length T2 of 2.65 mm and a width W2 of 0.1 mm. It should be noted that the length T2 of the transmission line 6 is adjusted to satisfy:

$$T2=\lambda \times (1/4) \times (2n-1),$$

where λ is the propagation wavelength at the series resonance frequency $f_{iO}$ of the second series resonance circuit, and n is a natural number. The length T3 of the coupling portion 7, which functions as a coupled transmission line together with the signal line 8, is adjusted to 0.65 mm, and the interval between the coupling portion 7 and the signal line 8 is adjusted to 0.3 mm. In the second embodiment, the length T1 and the width W of the transmission line 1 are adjusted to 2.4 mm and 0.075 mm, respectively, and the capacitance C1 of the capacitive structure 2 is adjusted to 12.2 fF.

In the second embodiment, the output impedance of the high frequency amplifier on the output terminal 5 (that is, on the drain of the amplifying FET 3) is fixed to substantially zero at the series resonance frequency $f_{iO}$ of the second series resonance circuit, since the transmission line 6 functions as an open stub; this is based on the fact that the coupling portion 7 of the transmission line 6, which is branched from the drain of the amplifying FET 3, functions as a coupled transmission line together with the signal line 8. In other words, the absolute value of the reflection coefficient |Γ| on the output terminal 5 is reduced down to one or less; in this case, Γ is approximately equal to −1. This effectively avoids the second series resonance circuit exhibiting negative resistance characteristics potentially resulting from the series resonance of the inductance L2 of the transmission line 6 and the capacitance C2 of the coupled transmission line formed between the coupling portion 7 and the signal line 8. As a result, the high frequency amplifier according to the second embodiment effectively reduces the input/output impedances down to approximately zero at the series resonance frequencies by using the first and second series resonance circuits, and thereby avoids the negative resistance characteristics, more effectively.

(Circuit Operation)

Figure 6:
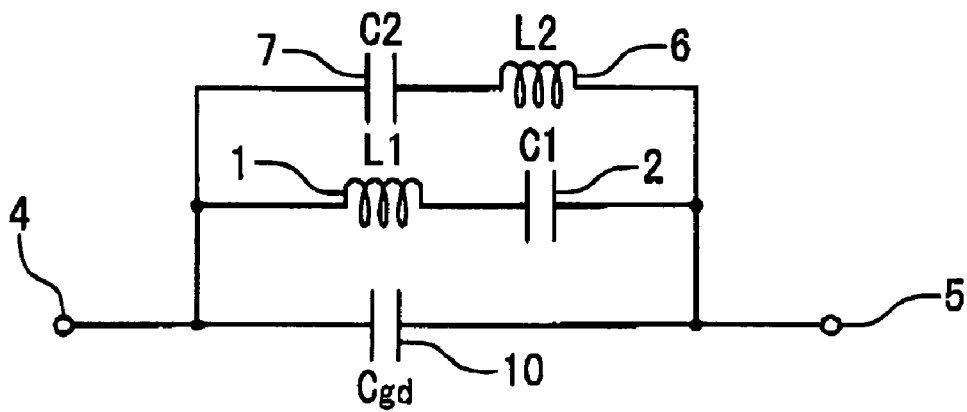
FIG. 6 is an equivalent circuit diagram illustrating feedback capacitance neutralization within the high frequency amplifier according to the second embodiment.

FIG. 6 is an equivalent circuit diagram illustrating the model of the feedback capacitance neutralization in the second embodiment. In FIG. 6, the feedback capacitance of the amplifying FET 3 is denoted by the symbol "Cgd".

As is understood from FIG. 6, the first and second series resonance circuits are connected in parallel to the feedback capacitance $C_{gd}$ to function as an external neutralization circuit; it should be noted that the first series resonance circuit is composed of the transmission line 1 (with the inductance L1) and the capacitive structure 2 (with the capacitance C1), which are serially connected, and the second series resonance circuit is composed of the transmission line 6 (with the inductance L2) and the coupled transmission line that is formed of the coupling portion 7 and the signal line 8 to provide the capacitance C2.

As is the case of the first embodiment, the external neutralization circuit exhibits parallel resonance of the feedback capacitance $C_{gd}$ and the inductances L1 and L2 of the first and second series resonance circuits at the operation frequency (typically, 20 GHz) This allows feedback capacitance neutralization at the operation frequency to increase the forward gain of the high frequency amplifier.

Figure 7:
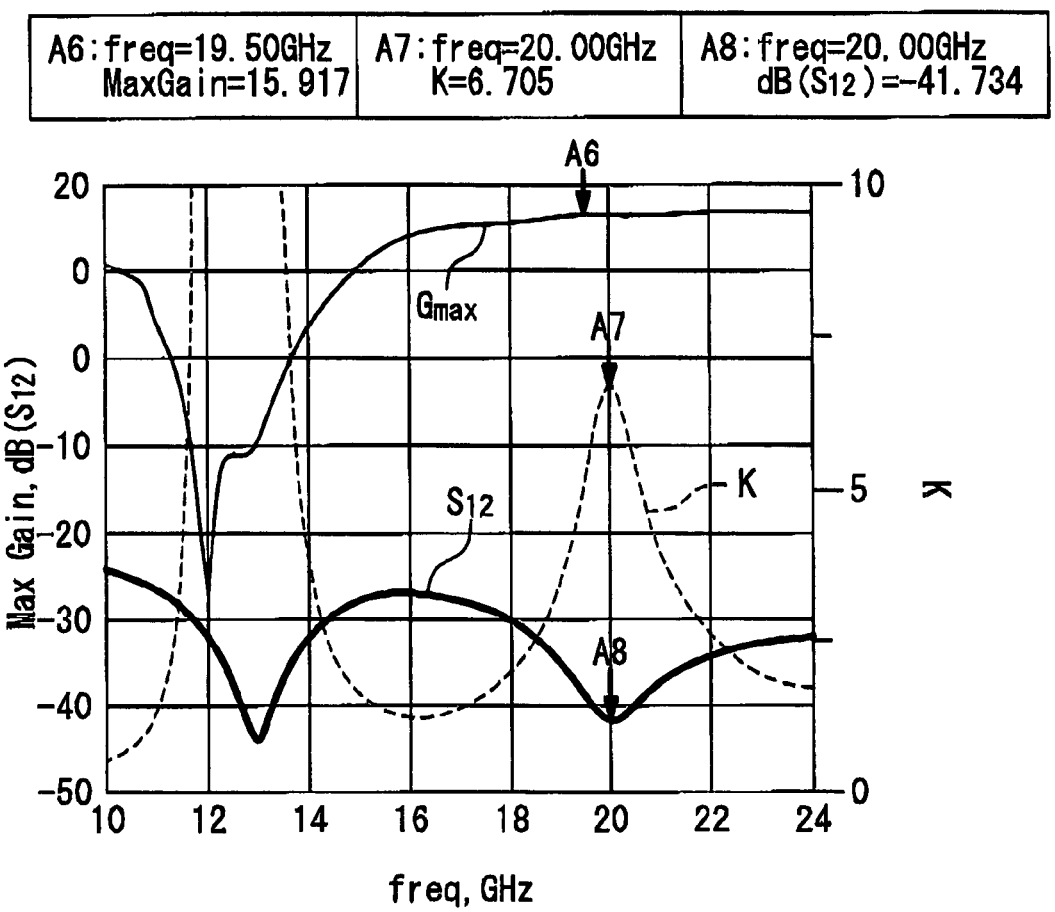
FIG. 7 is a graph illustrating RF characteristics of the high frequency amplifier according to the second embodiment.
Figures 8A, 8B:
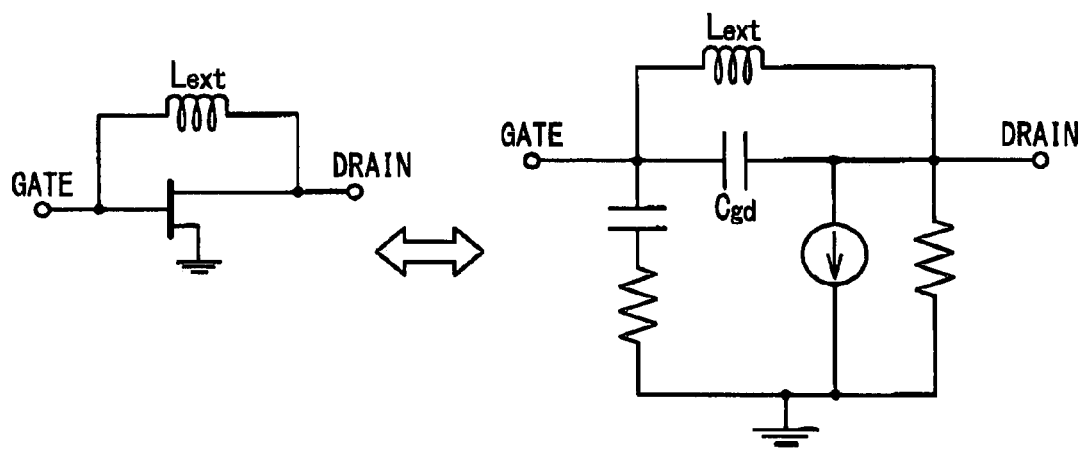
FIG. 8A is a circuit diagram illustrating an ideal configuration of a neutralization circuit.
FIG. 8B is an equivalent circuit diagram illustrating a high frequency amplifier with the neutralization circuit shown in FIG. 8A.
Figure 9:
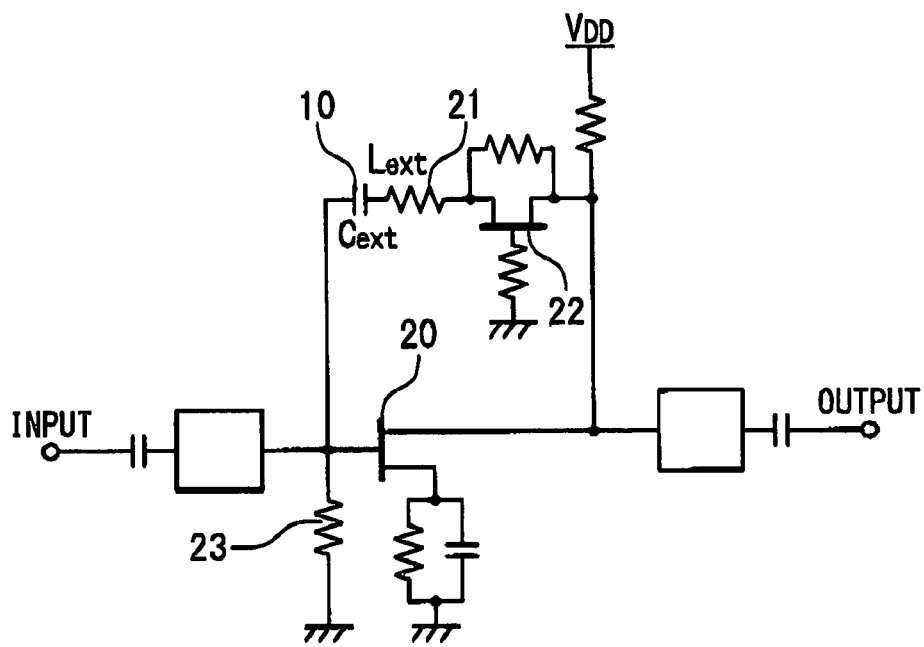
FIG. 9 is a circuit diagram illustrating the configuration of a conventional high frequency amplifier.

FIG. 7 is a graph illustrating exemplary RF characteristics of the high frequency amplifier according to the second embodiment. FIG. 7 illustrates the maximum available gain (Gmax: MaxGain), the reverse isolation S12, and the stability factor k. At the operation frequency of 20 GHz, the reverse isolation S12 is about −41.7 dB (as indicated by the symbol "A8"), which is a value remarkably superior to the intrinsic reverse isolation S12 of the amplifying FET 3. The stability factor k is 6.7 (as indicated by the symbol "A7"), which is a value larger than one; this implies the feedback capacitance neutralization is achieved at the operation frequency. It should be noted the intrinsic stability factor k of the amplifying FET 3 is less than one. Additionally, the maximum available gain Gmax is 15.92 dB (as indicated by the symbol "A3"), which is a value larger by about 2.2 dB than that of the conventional high frequency amplifier shown in FIG. 10, 13.7 dB.

As described above, as shown in FIG. 7, the high frequency amplifier according to the second embodiment effectively achieves the increase in the maximum available gain Gmax up to 16 dB, compared to the value of the intrinsic maximum available gain of the intrinsic amplifying FET 3, that is, 13.7 dB. Additionally, the reverse isolation S12 is remarkably increased up to 41.7 dB, compared to the value of the intrinsic reverse isolation S12, that is, 20 dB. Furthermore, the high frequency amplifier according to the second embodiment has a stability factor k (or Rollet factor k) of 6.7 in the 20 GHz band, and this implies that the high frequency amplifier effectively achieves neutralization in the 20 GHz band; it should be noted that the intrinsic stability factor k of the amplifying FET 3.

Furthermore, the input/output return losses S11 and S22 are reduced below 0 dB in the frequency range between 0 and 26 GHz. This implies that the high frequency amplifier according to the second embodiment operates stably, avoiding negative resistor characteristics.

It should be noted that the capacitive structure 2 with a small capacitance C1 (such as 12.2 fF) may be achieved by using the coupling capacitance between the transmission line 1, which functions as an open stub, and the signal line between the drain and the output terminal 5 across the spacing within the package. Such capacitive structure 2 may be designed by using a 3D electromagnetic field simulator.

Figure 5A:
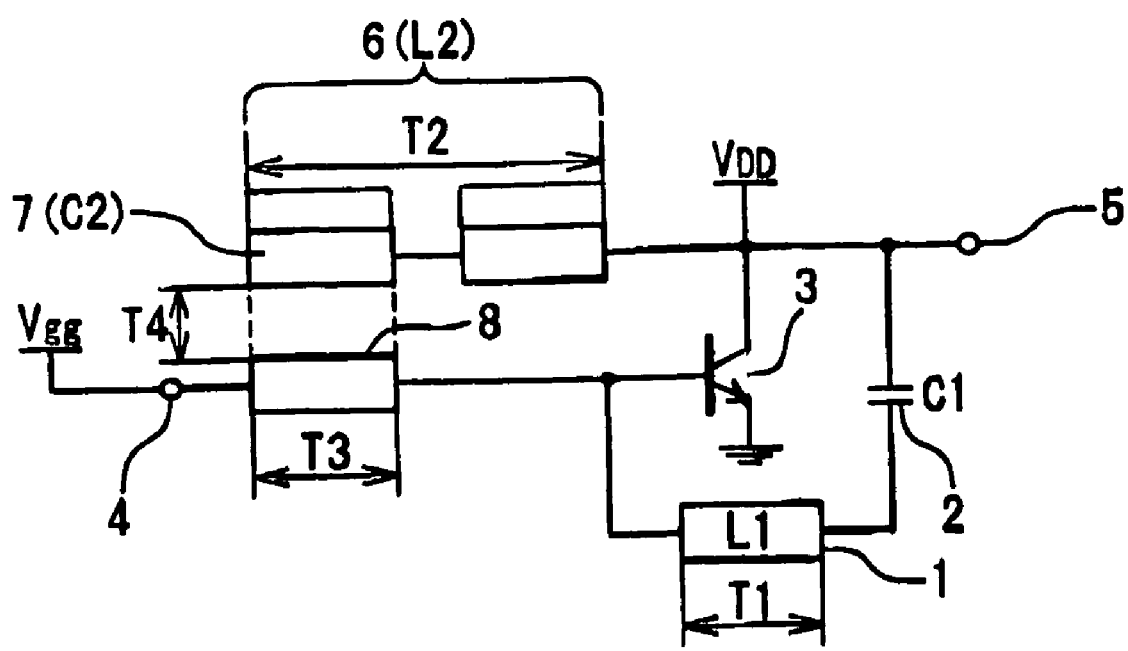

It should be noted that the transmission line 6 may be formed as other kinds of transmission lines, such as a coplanar waveguide, as exemplarily shown in FIG. 5A. Furthermore, a bipolar transistor may be used as the active element within the high frequency amplifier, in place of the amplifying FET 3, as shown exemplarily in FIG. 5A. In this case, the base of the bipolar transistor is connected with the input terminal 4, and the collector is connected with the output terminal 5.

In summary, the high frequency amplifiers according to the above-described embodiments effectively avoids negative resistance characteristics to achieve stable operations by using a neutralization circuit incorporating at least one transmission line having a length equal to or longer than the propagation wavelength at the operation frequency; the transmission line(s) effectively reduces the input and/or output impedances on the gate and/or drain of the amplifying FET 3 down to substantially zero (short-circuit).

It is apparent that the present invention is not limited to the above embodiments, but may be modified and changed without departing from the scope of the invention. Especially, it should be noted that the high frequency amplifier according to the second embodiment may use only the second series resonance circuit (which includes the transmission line 6) as the neutralization circuit, excluding the first series resonance circuit. It should be additionally noted that the capacitances C1 and C2 may be provided by other structures (such as a capacitor of an MIM (metal-insulator-metal) structure.

What is claimed is:

1. A high frequency amplifier comprising:
   an input terminal receiving a high frequency signal;
   an output terminal;
   a three-terminal active element having a first terminal connected with said input terminal and a second terminal connected with said output terminal, said three-terminal active element outputting an output signal from said output terminal in response to said high frequency signal;
   a transmission line; and
   a capacitive structure,
   wherein said transmission line and said capacitive structure are connected in series between said first and output terminals, and operate together as a series resonance circuit, and
   said transmission line functions as an open stub at a series resonance frequency of said series resonance circuit.

2. The high frequency amplifier according to claim 1, wherein a length of said transmission line is equal to $\lambda \times (1/4) \times (2n-1)$, where $\lambda$ is a propagation wavelength at said series resonance frequency, and n is a natural number.

3. The high frequency amplifier according to claim 1, wherein said transmission line and said capacitive structure neutralize a feedback capacitance of said three-terminal active element at an operation frequency of said high frequency amplifier.

4. The high frequency amplifier according to claim 3, wherein said length of said transmission line is equal to or longer than one fourth of a propagation wavelength at said operation frequency.

5. The high frequency amplifier according to claim 1, wherein said transmission line reduces an absolute value of a reflection coefficient on said input terminal down to one or less at said series resonance frequency.

6. The high frequency amplifier according to claim 1, wherein said transmission line has a first end connected with said input terminal and a second end connected with said output terminal through said capacitive structure.

7. The high frequency amplifier according to claim 6, wherein said capacitive structure is formed as a coupling capacitance between said transmission line and a signal line connected between said second terminal and said output terminal.

8. The high frequency amplifier according to claim 1, wherein said transmission line reduces an absolute value of a reflection coefficient on said output terminal down to one or less at said series resonance frequency.

9. The high frequency amplifier according to claim 1, wherein said transmission line has a first end connected with said output terminal,
   a portion of said transmission line operates as a coupled transmission line together with a signal line connected between said input terminal and said first terminal of said three-terminal active element.

10. The high frequency amplifier according to claim 1, further comprising an additional transmission line having an end connected with said output terminal, wherein said transmission line has a first end connected with said input terminal and a second end connected with said output terminal through said capacitive structure, and
    a portion of said additional transmission line operates as a coupled transmission line together with a signal line connected between said input terminal and said first terminal of said three-terminal active element.

11. The high frequency amplifier according to claim 1, wherein said transmission line includes a micro strip line.

12. The high frequency amplifier according to claim 1, wherein said transmission line includes a coplanar waveguide.

13. The high frequency amplifier according to claim 1, wherein said three-terminal active element includes a field effect transistor having a gate connected with said input terminal and a drain connected with said output terminal.

14. The high frequency amplifier according to claim 1, wherein said three-terminal active element includes a bipolar transistor having a base connected with said input terminal and a collector connected with said output terminal.

* * * * *